(12) United States Patent
Schechinger et al.

(10) Patent No.: US 6,819,186 B2
(45) Date of Patent: Nov. 16, 2004

(54) ELECTRICAL CIRCUIT ARRANGEMENT, PHASE LOCKED LOOP AND METHOD FOR OPERATING AN OSCILLATOR

(75) Inventors: Alois Schechinger, Wolnzach (DE); Volker Wannenmacher, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/240,701

(22) PCT Filed: Dec. 22, 2000

(86) PCT No.: PCT/DE00/04598
§ 371 (c)(1),
(2), (4) Date: Oct. 3, 2002

(87) PCT Pub. No.: WO01/76072
PCT Pub. Date: Oct. 11, 2001

(65) Prior Publication Data
US 2003/0222721 A1 Dec. 4, 2003

(51) Int. Cl.$^7$ .................................................. H03L 7/00
(52) U.S. Cl. ........................... 331/16; 331/17; 331/185; 327/156; 327/157
(58) Field of Search ........................... 331/16, 185, 17, 331/1 R, 1 A; 327/156, 157

(56) References Cited

U.S. PATENT DOCUMENTS

| | | | | |
|---|---|---|---|---|
| 5,359,300 A | | 10/1994 | Minami | ........................ 331/17 |
| 6,215,362 B1 | * | 4/2001 | Feng et al. | .................... 331/17 |
| 6,476,681 B1 | * | 11/2002 | Kirkpatrick | .................... 331/17 |

FOREIGN PATENT DOCUMENTS

| | | |
|---|---|---|
| DE | 39 38 292 | 5/1991 |
| EP | 0 561 257 | 9/1992 |
| EP | 0 829 968 | 3/1998 |

* cited by examiner

Primary Examiner—Arnold Kinkead
(74) Attorney, Agent, or Firm—Bell Boyd & Lloyd LLC

(57) ABSTRACT

A method is provided for operating a voltage controlled oscillator, particularly in a portable communications appliance, when the oscillator is supplied with a variable control voltage, which is taken from an operating voltage, preferably from a constant voltage source, such that the variable control voltage is supplied via a capacitor to the oscillator, and the specific additional voltage is added to the variable control voltage when required in an operating phase, with the specific additional voltage being inclined to the capacitor in a preparation phase.

11 Claims, 2 Drawing Sheets

U5 = U4 + U2

U5 = U4

ELECTRICAL CIRCUIT ARRANGEMENT, PHASE LOCKED LOOP AND METHOD FOR OPERATING AN OSCILLATOR

BACKGROUND OF THE INVENTION

The present invention relates to a method for operating a voltage controlled oscillator, particularly in a portable communications appliance, with the oscillator being supplied with a variable control voltage which is taken from an operating voltage, preferably from a constant voltage source.

The present invention also relates to an electrical circuit arrangement for controlling a voltage controlled oscillator, with the oscillator having at least one control input for a variable control voltage, and at least one input for an operating voltage.

The present invention furthermore relates to a phase locked loop having at least one detector which produces a variable control voltage, having a filter arrangement and having an oscillator, with the oscillator having at least one control input for the variable control voltage, and at least one input for an operating voltage.

Voltage controlled oscillators are used in communications technology appliances in order to produce radio-frequency sinusoidal voltages. In these oscillators, the output frequency can be varied or tuned within a specific range via a control input. In this case, the magnitude of this tunable frequency range, which is also referred to as the pull-in range, is defined by minimum and maximum voltage which can be supplied to the control input. In this case, the maximum voltage is governed by the available operating voltage.

Two requirements often conflict with one another during operation of modern communications appliances. These communications appliances frequently require the oscillator to have a wide pull-in range, but at the same time operate with low operating voltages; for example, because they are battery-powered. Oscillators which cover a wide pull-in range with only a low control voltage admittedly can be produced, but they often suffer from high sensitivity and poor phase noise characteristics. This is further exacerbated by the use of such oscillators in a phase locked loop.

Until now, in order to solve this problem, the operating voltage of the overall appliance has, for example, been increased by using DC/DC converters or charge parts. However, this solution is expensive, and there is a risk of spectral impurities due to AF interference (AF=audio frequency). Furthermore, a number of oscillators are used, each of which covers only a portion of the desired frequency range. However, this variant now results in enormous costs. Switched oscillators are used in another proposal, in which a sudden frequency change can be produced by switching the resonator circuit, generally via PIN diodes. However, in this case, the design and configuration of such an oscillator are problematic.

An object of the present invention is, thus, to provide a method which allows the pull-in range of an oscillator to be extended in a simple and disturbance-free manner. A further object of the present invention is to provide an electrical circuit arrangement and a phase locked loop for carrying out the method.

SUMMARY OF THE INVENTION

Accordingly, the inventor proposes the further development of a method for operating a voltage controlled oscillator, particularly in a portable communications appliance, with the oscillator being supplied with a variable control voltage, which is taken from an operating voltage, preferably from a constant voltage source, such that the variable control voltage is supplied via a capacitor to the oscillator, and a specific additional voltage is added to the variable control voltage when required in an operating phase, with the specific additional voltage being inclined to the capacitor in a preparation phase. The method for operating the voltage controlled oscillator is thus broken down into a preparation phase and an operating phase.

The capacitor is advantageously charged during the preparation phase with the aid of a charging voltage, which is applied to the capacitor. This charging voltage now may be equal to the operating voltage, so that, at the end of the preparation phase, the capacitor is at a voltage (additional voltage) which is equal to the operating voltage. In the operating phase, this additional voltage may be added to the variable control voltage, as a result of which the input voltage range of the oscillator is increased by the magnitude of the additional voltage, and the pull-in range of the oscillator is consequently widened.

One advantageous embodiment of the method according to the present invention provides for the charging time to be controlled by interrupting the charging voltage which is applied to the capacitor. The charging process of the capacitor in the preparation phase may be interrupted, for example, via a control apparatus, which opens a switch after a predetermined charging time, and thus interrupts the charging of the capacitor. The additional voltage which is now present across the capacitor is less than the charging voltage, or less than the operating voltage. The magnitude of the additional voltage across the capacitor is thus dependent on the duration of its charging time. This further development allows for the control voltage to be continuously variably increased, so that the pull-in range of the oscillator can be tuned over a wide frequency range.

A further embodiment of the method according to the present invention provides for an additional voltage to be produced which is in the opposite sense to the charging voltage. This makes it possible for negative additional voltages to be present across the capacitor and, henceforth, even greater variability to be achieved.

In another embodiment of the method according to the present invention, when a low control voltage is desired across the oscillator rather than a high control voltage, the capacitor is discharged to a voltage 0 during the preparation phase. The control voltage, unchanged by the capacitor, is thus produced across the oscillator in the operating phase.

Furthermore, the capacitor is neither charged nor discharged during the operating phase.

In addition, the method according to the present invention is further developed such that the method is carried out on the control voltage of a phase locked loop. A specific additional voltage thus can also be produced here when required during a preparation phase which, in an operating phase, is added to the variable control voltage of a phase locked loop. This results in the input voltage range of the oscillator of a phase locked loop, and hence also its pull-in range, being increased.

The method according to the present invention is thus substantially suitable for those oscillators or phase locked loops which are not operating continuously.

The inventor furthermore proposes the development of an electrical circuit arrangement for controlling a voltage controlled oscillator, with the oscillator having at least one control input for a variable control voltage, and at least one input for an operating voltage, such that a capacitor is provided in series with the control input of the oscillator, and may be precharged in a preparation phase. If an additional voltage, which is produced during the precharging, is now added to the control voltage, a higher control voltage can be made available to the oscillator at its control input.

In one preferred embodiment of the electrical circuit arrangement according to the present invention, at least one switching device is provided for precharging, with the capacitor being charged with the aid of a charging voltage depending on the position of the switching device. At least three, and possibly four, switching devices are advantageously provided for precharging.

A further advantageous embodiment of the electrical circuit arrangement according to the present invention provides for at least one switching device to represent at least one transistor, at least one diode or at least one switch. The switching device also may be formed by combinations of transistors, diodes and switches.

One advantageous further embodiment of the electrical circuit arrangement according to the present invention is to provide a control apparatus for operating at least one switching device. This control apparatus interrupts the additional voltage of the capacitor by interrupting the charging voltage.

The control apparatus furthermore can be designed such that the charging time can be varied. For example, it may contain a timer which causes the control apparatus to interrupt the charging process after a predetermined charging time. By way of example, the capacitor may be charged via a resistor or a current source before the control apparatus opens a switch, and hence ends the charging process. Furthermore, the control apparatus may be in the form of a program part.

Since most voltage controlled oscillators are not operated in a free-running manner, but are part of a phase locked loop, the inventor proposes the further development of a phase locked loop having at least one detector which produces a variable control voltage, having a filter arrangement and having an oscillator, with the oscillator having at least one control input for the variable control voltage and at least one input for an operating voltage, such that the electrical circuit arrangement according to the present invention as mentioned above is provided upstream of the control input of the oscillator. The filter arrangement is, for example, a loop filter, through which DC voltages can pass.

In one preferred embodiment of the phase locked loop according to the present invention, the detector has two complimentary arranged transistors, which each carry out the function of a switching device in a preparation phase. The transistors which are presents in the detector are thus also used for capacitor charging. As such, the capacitor can be both charged and discharged depending on the position of the transistors and a further switch. After the preparation phase, that is to say in the operating phase, the transistors once again operate as phase detectors.

Further features of the present invention can be found in the following description of a number of exemplary embodiments, with reference to the drawings, with an operating voltage of 2.8 V and a control voltage of 0.3 V to 2.2 V being assumed. It is also assumed that the control input of the oscillator has only a negligible current consumption (good approximation for varactor-controlled oscillators).

DETAILED DESCRIPTION OF THE INVENTION

Figure 1A:
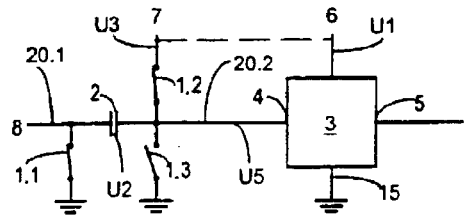
FIG. 1a shows a circuit arrangement according to the present invention in a preparation phase with a capacitor being precharged.

FIG. 1a shows an electrical circuit arrangement according to the present invention in a preparation phase, with the capacitor 2 being charged (precharging). The circuit arrangement includes a circuit input 8, and input 7 for a charging voltage U3 as well as an oscillator 3, having a control input 4 for a control voltage U5, an RF output 5, a line to ground 15 and an input 6 for an operating voltage U1. The circuit arrangement also has three switches 1.1 to 1.3. The capacitor 2 is arranged between the circuit input 8 and the control input 4 of the oscillator 3.

A circuit-input-side line 20.1 runs between the circuit input 8 and the capacitor 2, and an oscillator-side line 20.2 runs between the capacitor 2 and the control input 4 of the oscillator 3. The switch 1.2 connects the input 7 to the line 20.2, the switch 1.1 connects the line 20.1 to ground, and the switch 1.3 connects the line 20.2 to ground.

In the preparation phase, the capacitor 2 is charged by the charging voltage U3 which is applied to the input 7, with the switches 1.1 and 1.2 being closed, and the switch 1.3 being open. The charging voltage U3 is in this case equal to the operating voltage U1 (2.8 V), represented by the dashed line between the inputs 7 and 6. At the end of the preparation phase, the capacitor 2 is at an additional voltage U2 (2.8 V), which is equal to the charging voltage U3.

It is self-evident that the charging voltage U3 need not be the same as the operating voltage U1, but may have a different value when, for example, a second operating voltage is provided.

Figure 1B:
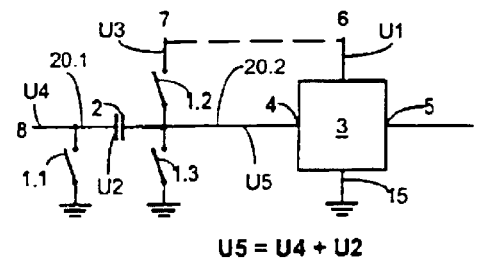
FIG. 1b shows a circuit arrangement according to the present invention in an operating phase, after precharing of the capacitor.

FIG. 1b shows an electrical circuit arrangement according to the present invention in an operating phase after the precharging of the capacitor 2. All the switches 1.1 to 1.3 are open, and a control voltage U4 (0.3 V to 2.2 V) is applied to the circuit input 8. The additional voltage U2 (2.8 V) of the capacitor 2 is added to the incoming control voltage U4, so that the control voltage U5 at the control input 4 of the oscillator 3 is now greater by the magnitude of the additional voltage U2 than the control voltage U4 at the circuit input 8. The control voltage U5 accordingly has values between 3.1 V and 5 V.

Since the oscillator 3 changes the frequency at its RF output 5 as a function of the control voltage U5, the pull-in range of the oscillator 3, that is to say the magnitude of its tunable frequency range, can be widened by increasing the control voltage U5.

Figure 2A:
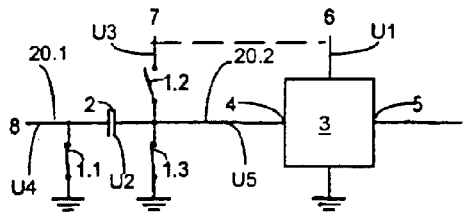
FIG. 2a shows a circuit arrangement according to the present invention in the preparation phase, without the capacitor being precharged.
Figure 2B:
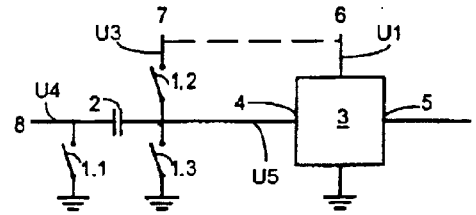
FIG. 2b shows a circuit arrangement according to the present invention in the operating phase, without the capacitor having been precharged.

If a low control voltage U5 is desired at the oscillator 3 rather than a high control voltage, then the procedure as illustrated in FIGS. 2a and 2b is used.

FIG. 2a shows the circuit arrangement according to the present invention in the preparation phase without the capacitor 2 being precharged. In this case, the grounded switches 1.1 and 1.3 are closed, and the switch 1.2 is opened, so that the capacitor 2 remains uncharged.

FIG. 2b shows the operating phase of the circuit arrangement, without the capacitor 2 having previously been charged. In this case, the control voltage U5 at the control input 4 of the oscillator 3 has the same value as the control voltage U4 at the circuit input 8, namely 0.3 V to 2.2 V.

If the circuit from FIGS. 1a, 1b, 2a and 2b is operated using the control voltage U4 from 0.3 V to 2.2 V and using an operating voltage U1 and a charging voltage U3 of 2.8 V in each case, then this results in the control voltage U5 of 0.3 V to 2.2 V at the control input 4 of the oscillator 3, without the capacitor 2 having been precharged, and 3.1 V to 5 V with precharging. This results in a gap of from 2.2 V to 3.1 V, which is not covered.

Figure 5A:
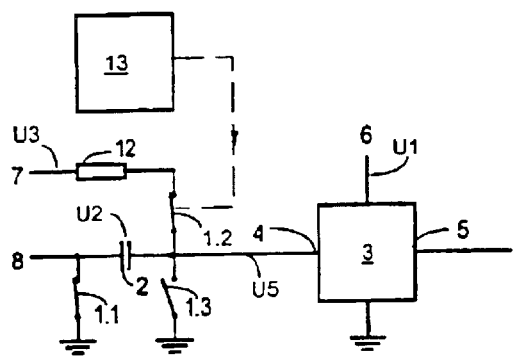
FIG. 5a shows a circuit arrangement according to the present invention with a variable bias voltage via a resistor.
Figure 5B:
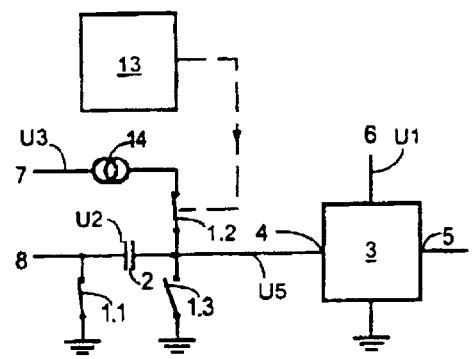
FIG. 5b shows a circuit arrangement according to the present invention with a variable bias voltage via a current source.

This gap can be overcome by choosing a charging voltage U3 which is less than or equal to 1.9 V. However, since it may be undesirable to provide a further operating voltage U1, FIG. 1a is developed as is shown in FIGS. 5a and 5b.

Figure 3A:
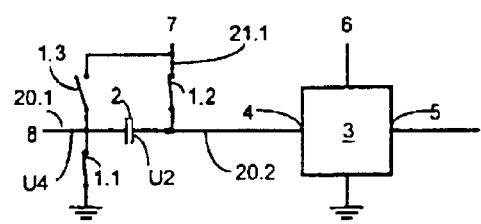
FIGS. 3a,b show a circuit arrangement according to the present invention with an alternative switch arrangement in the preparation phase.
Figure 3B:
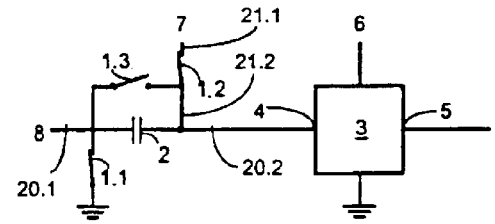

FIGS. 3a and 3b show alternative exemplary embodiments of the circuit arrangement according to the present invention, which may achieve the same purpose as the circuit arrangements in the previous figures. FIGS. 3a and 3b show the switch positions in the preparation phase.

In FIG. 3a, the switch 1.1 connects the circuit-input-side line 20.1 to ground, the switch 1.2 connects the input 7 to the oscillator-side line 20.2, and the switch 1.3 connects the line 20.1 to the line 21.1, which runs between the switch 1.2 and the input 7. In order to charge the capacitor 2 to an additional voltage U2, the switches 1.1 and 1.2 are closed and the switch 1.3 is open.

In a subsequent operating phase, all the switches 1.1 to 1.3 are open, so that the additional voltage U2 across the capacitor 2 is added to the control voltage U4.

In FIG. 3b, the switch 1.1 also connects the line 20.1 to ground, and the switch 1.2 connects the input 7 to the line 20.2. In this case, the switch 1.3 now connects the line 20.1 to the line 21.2, which runs between the switch 1.2 and the line 20.2. As in FIG. 3a, the switches 1.1 and 1.2 are closed for charging the capacitor 2, and the switch 1.3 is opened.

If the capacitor 2 is to be discharged, this is achieved by opening the switch 1.2 and closing the switch 1.3.

Figure 4A:
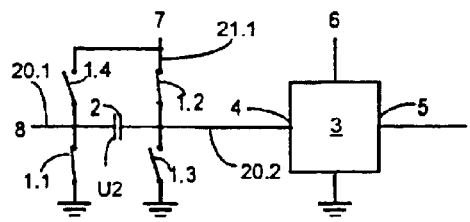
FIG. 4a shows a circuit arrangement according to the present invention in the preparation phase, for positive precharging of the capacitor.
Figure 4B:
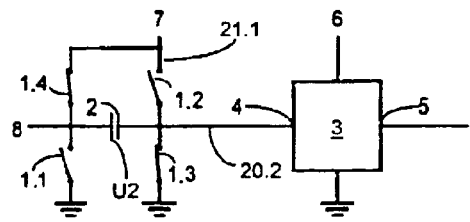
FIG. 4b shows a circuit arrangement according to the present invention in the preparation phase, for negative precharging of the capacitor.

FIGS. 4a and 4b show two exemplary embodiments of a so-called full bridge with the four switches 1.1 to 1.4.

In FIG. 4a, the switch 1.1 connects the line 20.1 to ground, the switch 1.3 (which is arranged in parallel with it) connects the line 20.2 to ground, and the switch 1.2 connects the input 7 to the line 20.2. The connection between the line 20.1 and the line 21.1 is produced via the switch 1.4. When the switches 1.3 and 1.4 are open and the switches 1.1 and 1.2 are closed, the capacitor 2 is charged to a positive additional voltage U2, as is shown in FIG. 4a.

The full bridge in FIG. 4b allows the capacitor to be charged to negative additional voltages U2. The arrangement of the switches 1.1 to 1.4 is analogous to the switch arrangement shown in FIG. 4a, but with the switches 1.2 and 1.1 now being open, and the switches 1.3 and 1.4 being closed.

All the switches 1.1 to 1.4 are open, both in FIG. 4a and in FIG. 4b, during an operating phase that follows the preparation phase.

FIG. 5a shows one preferred embodiment of the circuit arrangement according to the present invention, in which the additional voltage U2 across the capacitor 2 can be varied.

In contrast to FIG. 1a, there is a resistor 12 between the input 7 for the charging voltage U3 and the switch 1.2. The circuit arrangement also has a controller 13, which can open and close the switch 1.2, represented by the dashed line. The capacitor 2 is now charged on the basis of the charging voltage U3, which is applied to the input 7, via the resistor 12. As in FIG. 1a, the switches 1.2 and 1.1 are closed, and the switch 1.3 is open. After a predetermined charging time, the controller 13 opens the switch 1.2 and thus ends the process of charging the capacitor 2. During the subsequent operating phase, all the switches 1.1 to 1.3 are open.

This preferred embodiment allows additional voltages U2 to be produced across the capacitor 2 which are between 0 V and the charging voltage U3 or the operating voltage U1. When additional voltages U2 between 0.1 V and 0.9 V are produced, this makes it possible to cover the gap, which occurs in FIGS. 1a to 2b, from 2.2 V to 3.1 V in the control voltage U5 at the input 4 of the oscillator 3.

FIG. 5b shows another circuit arrangement according to the present invention, with the resistor 12 from FIG. 5a being replaced by a current source.

Figure 6:
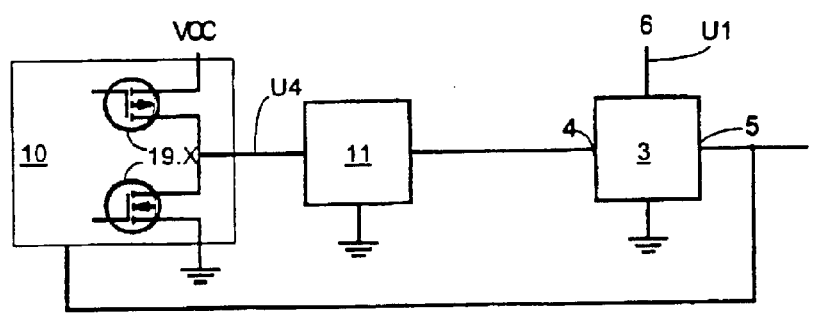
FIG. 6 shows a known phase locked loop.

FIG. 6 shows the design of a conventional phase locked loop. In a phase locked loop, the output frequency of the oscillator 3 has a rigid phase relationship with a reference frequency by virtue of a filter arrangement 11 (for example, a loop filter), a phase/frequency detector 10, an oscillator 3, which has a control input 4, an input 6 for the operating voltage U1 and an RF output 5, and a frequency divider (not illustrated here).

The detector 10 produces a control voltage U4, which passes through the filter arrangement 11 and reaches the control input 4 of the oscillator 3. Depending on the magnitude of the control voltage U4, an output frequency is generated, which is supplied to the detector 10 once again, via the frequency divider. This detector 10 then compares the output frequency with the reference frequency, and regulates the control voltage U4 appropriately.

In this case, a phase detector which has two transistors 19.X (charge pump transistors) is shown as the detector 10. The output of this detector 10 has current source characteristics, with the transistors 19.X simulating the current sources. Other variants for a detector 10 would be, for example, a simple analogue mixer, an EXOR gate or a ring mixer.

Figure 7:
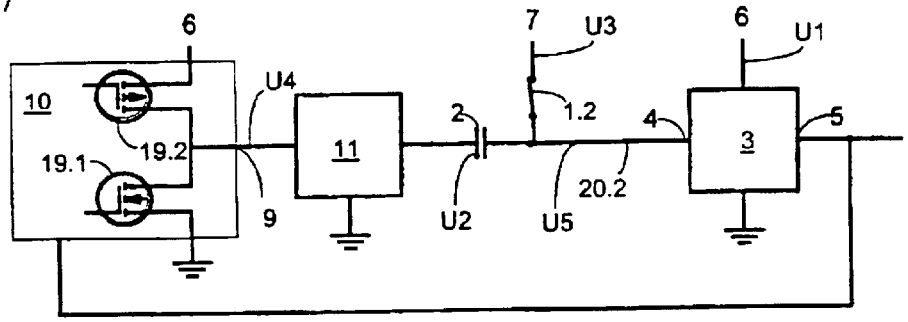
FIG. 7 shows a phase locked loop according to the present invention with a capacitor.

FIG. 7 shows one preferred exemplary embodiment of the phase locked loop according to the present invention, which represents a development of the conventional phase locked loop shown in FIG. 6. In this case, a capacitor 2 is arranged between the filter arrangement 11 and the control input 4 of the oscillator 3. The capacitor 2 also may be arranged upstream of the filter arrangement 11, although, in this variant, relatively large capacitance values are required for the capacitor 2.

Furthermore, a switch 1.2 connects the input 7 for the charging voltage U3 to the oscillator-side line 20.2 between the capacitor 2 and the oscillator 3. In this case, the filter arrangement 11 is in the form of a loop filter, through which DC voltages can normally pass.

A passive loop filter (capacitor) is preferably used as the filter arrangement 11, which has constant current sources which charge or discharge the filter 11. In order to achieve better interference suppression, a tuning voltage produced in this way is also passed via an RC low-pass filter. The loop filter 11 may thus have a series resistance (DC resistance) which does not interfere with the operation of the circuit in FIG. 7 provided, however, that it is sufficiently small. This means that the DC resistance should be so small that it is possible to fully charge the capacitor 2 during the preparation phase, despite the DC resistance.

The output 9 of the phase/frequency detector 10 has two complimentary arranged transistors 19.1 and 19.2 (charge pump transistors); that is to say, by way of example, two MOSFETs. Each of these individual MOSFETs may, if desired, be opened or closed as required. If they are suitably controlled, these transistors 19.X may, in the preparation phase, carry out the function of the switch 1.1 from FIGS. 1a and 2a, and the function of the switches 1.1 and 1.3 from FIGS. 3a and 3b.

In order to charge the capacitor 2 to the additional voltage U2, the switch 1.2 and the transistor 19.1 are closed in the preparation phase. In contrast, the switch 19.2 is open.

In the operating phase, the switch 1.2 is open, the transistors 19.1 and 19.2 operate as normal phase detectors, and the additional voltage U2 is added to the control voltage U4 emitted from the detector 10. The control voltage U5 is now applied to the input 4 of the oscillator 3, and is composed of the additional voltage U2 and the control voltage U4. Thus, in this operating phase, the transistors 19.1 and 19.2 once again operate as normal, as phase detectors.

It is self-evident that other phase detectors also may be used instead of a detector 10 having transistors 19.X, such as a mixer which has no output transistors 19.X, for example. According to the present invention, one of the circuit arrangements as described above from FIGS. 1a to 5b may be located between the phase detector and the oscillator 3, and can be used to increase the control voltage U5 at the control input 4 of the oscillator 3. In this case, an active loop filter also may be used as the filter arrangement 11.

Overall, the invention provides a method which allows the pull-in range of an oscillator to be widened in a simple and disturbance-free manner. Furthermore, an electrical circuit arrangement and a phase locked loop are proposed, in order to carry out the method.

Although the present invention has been described with reference to specific embodiments, those of skill in the art will recognize that changes may be made thereto without departing from the spirit and scope of the present invention as set forth in the hereafter appended claims.

What is claimed is:

1. A method for operating a voltage controlled oscillator in a portable communications apparatus, the method comprising the steps of:

providing an operating voltage from a constant voltage source;

supplying a variable control voltage, which is taken from the operating voltage, to the oscillator via a capacitor;

adding a specific additional voltage to the variable control voltage when required in an operating phase;

applying the specific additional voltage to the capacitor and charging the capacitor with the aid of a charging voltage, which is applied to the capacitor and may be equal to the operating voltage, in a preparation phase, wherein the specific additional voltage is formed opposite to the charging voltage.

2. A method for operating a voltage controlled oscillator as claimed in claim 1, the method further comprising the step of controlling the specific additional voltage of the capacitor by interrupting the charging voltage for the capacitor.

3. A method for operating a voltage controlled oscillator as claimed in claim 1, the method further comprising the step of discharging the capacitor during the preparation phase.

4. A method for operating a voltage controlled oscillator as claimed in claim 1, wherein the capacitor is neither charged nor discharged during the operating phase.

5. A method for operating a voltage controlled oscillator as claimed in claim 1, wherein the method is carried out on the variable control voltage of a phase locked loop.

6. An electrical circuit arrangement for controlling a voltage controlled oscillator in a portable communications apparatus, comprising:

at least one input for providing an operating voltage from a constant voltage source;

at least one control input for supplying a variable control voltage, which is taken from the operating voltage, to the oscillator;

a capacitor provided in series between the control input and the oscillator, wherein a specific additional voltage, which is added to the variable control voltage when required in an operating phase, is applied to the capacitor and the capacitor is precharged in a preparation phase; and at least one switching device for precharging, wherein the capacitor is charged with the aid of a charging voltage depending on a position of the at least one switching device, the charging voltage may be equal to the operating voltage, and the specific additional voltage is formed opposite to the charging voltage.

7. An electrical circuit arrangement for controlling a voltage controlled oscillator as claimed in claim 6, wherein at least three switching devices are provided for precharging.

8. An electrical circuit arrangement for controlling a voltage controlled oscillator as claimed in claim 6, wherein the at least one switching device is selected from the group consisting of a transistor, a diode and a switch.

9. An electrical circuit arrangement for controlling a voltage controlled oscillator as claimed in claim 6, further comprising a control apparatus for operating the at least one switching device.

10. An electrical circuit arrangement for controlling a voltage controlled oscillator as claimed in claim 6, wherein the control apparatus is designed such that charging time can be varied.

11. A phase locked loop for controlling a voltage controlled oscillator in a portable communications apparatus, comprising:

a voltage controlled oscillator;

at least one input to the oscillator to which an operating voltage is provided from a constant voltage source;

at least one detector for supplying a variable controlled voltage to the oscillator, wherein the at least one detector includes two complementary arranged transistors serving as two switching devices in a preparation phase;

a filter arrangement and a capacitor provided in series between the at least one detector and the oscillator, wherein a specific additional voltage, which is added to the variable control voltage when required in an operating phase, is applied to the capacitor and the capacitor is precharged in a preparation phase; and at least one further switching device for precharging, wherein the capacitor is charged with the aid of a charging voltage depending on a position of the at least one further switching device and the two switching devices of the at least one detector, the charging voltage may be equal to the operating voltage, and the specific additional voltage is formed opposite the charging voltage.

* * * * *